(12) United States Patent
Sampson et al.

(10) Patent No.: US 9,385,051 B2
(45) Date of Patent: Jul. 5, 2016

(54) METHOD FOR THE FORMATION OF A FINFET DEVICE HAVING PARTIALLY DIELECTRIC ISOLATED FIN STRUCTURE

(71) Applicant: STMicroelectronics, Inc., Coppell, TX (US)

(72) Inventors: Ronald K. Sampson, Lagrangeville, NY (US); Nicolas Loubet, Guilderland, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 14/822,959

(22) Filed: Aug. 11, 2015

(65) Prior Publication Data
US 2015/0348851 A1  Dec. 3, 2015

Related U.S. Application Data

(62) Division of application No. 14/097,570, filed on Dec. 5, 2013, now Pat. No. 9,136,384.

(51) Int. Cl.
*H01L 21/84* (2006.01)
*H01L 29/78* (2006.01)
*H01L 29/66* (2006.01)
*H01L 29/06* (2006.01)
*H01L 21/02* (2006.01)
*H01L 21/28* (2006.01)
*H01L 29/10* (2006.01)

(52) U.S. Cl.
CPC .......... *H01L 21/845* (2013.01); *H01L 21/0257* (2013.01); *H01L 21/02529* (2013.01); *H01L 21/02532* (2013.01); *H01L 21/28035* (2013.01); *H01L 29/0649* (2013.01); *H01L 29/0653* (2013.01); *H01L 29/1083* (2013.01); *H01L 29/6656* (2013.01); *H01L 29/66545* (2013.01); *H01L 29/66795* (2013.01); *H01L 29/785* (2013.01); *H01L 29/7848* (2013.01); *H01L 29/0673* (2013.01)

(58) Field of Classification Search
CPC ...................................... H01L 21/845
USPC ........................................... 439/149
See application file for complete search history.

(56) References Cited

U.S. PATENT DOCUMENTS 6,645,797 B1  11/2003  Buynoski et al.
8,969,974 B2   3/2015  Liaw
(Continued)

OTHER PUBLICATIONS

Hisamoto, Digh, et al: "FinFET—A Self-Aligned Double-Gate MOSFET Scalable to 20 nm," IEEE Transactions on Electron Devices, vol. 47, No. 12, Dec. 2000, pp. 2320-2325.

*Primary Examiner* — Ajay K Arora
(74) *Attorney, Agent, or Firm* — Gardere Wynne Sewell LLP

(57) ABSTRACT

A semiconductor material is patterned to define elongated fins insulated from an underlying substrate. A polysilicon semiconductor material is deposited over and in between the elongated fins, and is patterned to define elongated gates extending to perpendicularly cross over the elongated fins at a transistor channel. Sidewall spacers are formed on side walls of the elongated gates. Portions of the elongated fins located between the elongated gates are removed, along with the underlying insulation, to expose the underlying substrate. One or more semiconductor material layers are then epitaxially grown from the underlying substrate at locations between the elongated gates. The one or more semiconductor material layers may include an undoped epi-layer and an overlying doped epi-layer. The epitaxial material defines a source or drain of the transistor.

23 Claims, 10 Drawing Sheets

(56) References Cited

U.S. PATENT DOCUMENTS

| | | |
|---|---|---|
| 2008/0224183 A1 | 9/2008 | Nawaz |
| 2009/0095980 A1 | 4/2009 | Yu et al. |
| 2010/0163971 A1 | 7/2010 | Hung et al. |
| 2014/0284667 A1* | 9/2014 | Basker ................ H01L 29/6681 257/288 |
| 2015/0001591 A1 | 1/2015 | Akarvardar et al. |
| 2015/0014773 A1 | 1/2015 | Cheng et al. |

* cited by examiner

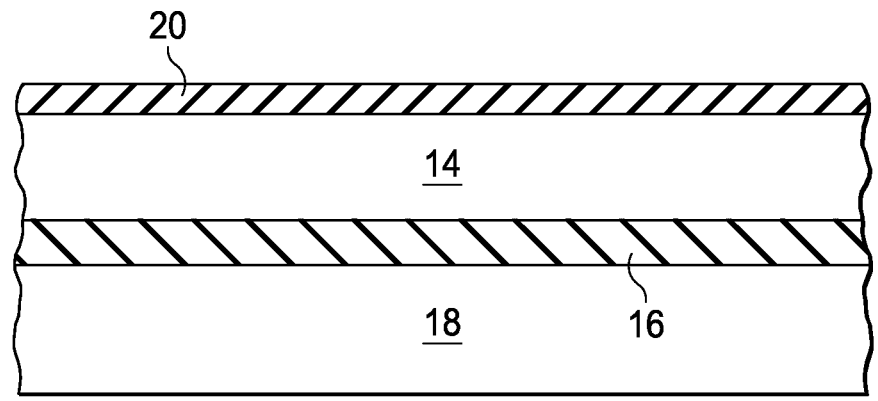
FIG. 2A
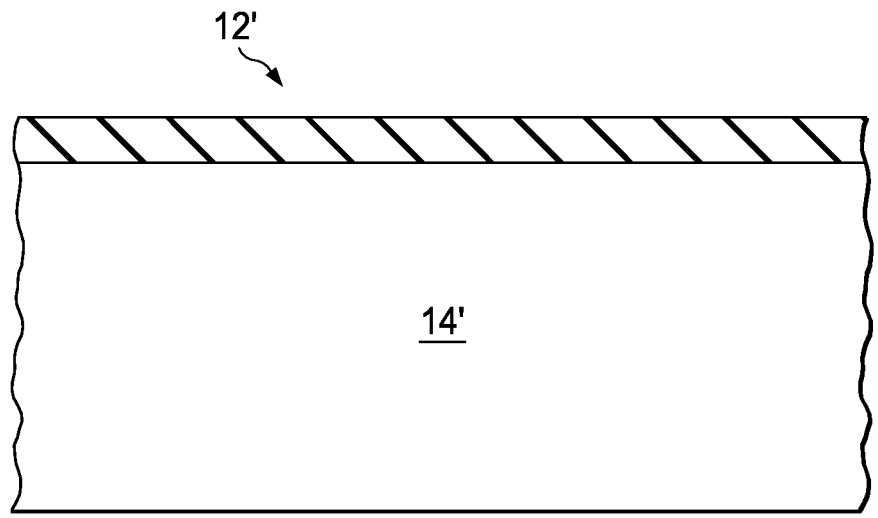
FIG. 2B
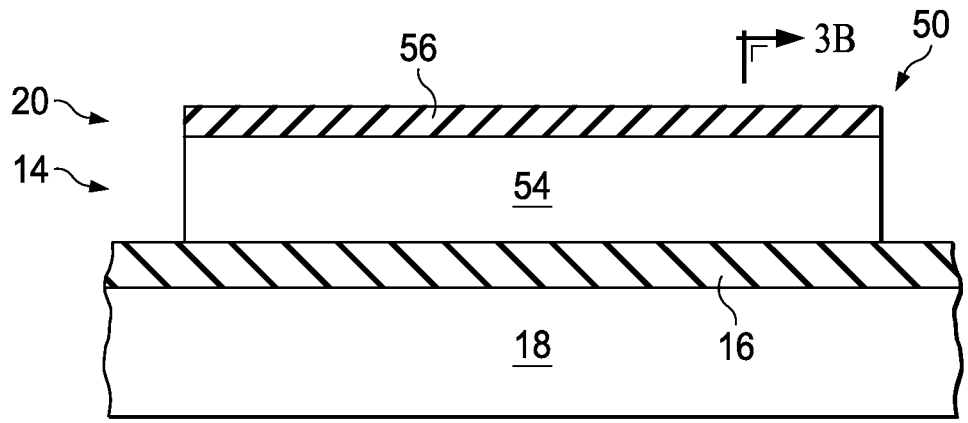

METHOD FOR THE FORMATION OF A FINFET DEVICE HAVING PARTIALLY DIELECTRIC ISOLATED FIN STRUCTURE

CROSS-REFERENCE TO RELATED APPLICATION

This application claims priority from U.S. application patent Ser. No. 14/097,570 filed Dec. 5, 2013, the disclosure of which is incorporated by reference.

TECHNICAL FIELD

The present invention relates to integrated circuits and, in particular, to a process for the formation of FinFET-type integrated circuit devices and a device produced by such a process.

BACKGROUND

The prior art teaches the formation of integrated circuits which utilize one or more FinFET type field effect transistors. The FinFET transistor comprises a channel region which is oriented to conduct an electrical current parallel to the surface of the substrate. The channel region is provided in an elongated section of semiconductor material referred to as a fin. The source and drain regions of the transistor are typically also formed in the elongated section on either side of the channel region. A gate is placed over and on both opposed sides of the elongated section at the location of the channel region to provide control over the conductive state of the transistor. This FinFET design is well suited for manufacturing a multi-channel transistor in which multiple elongated sections are formed in parallel to define neighboring channel regions that are separated from each other by an intermediate gate portion of the transistor gate spanning with a perpendicular orientation over the multiple elongated sections.

A FinFET transistor is created from at least one thin portion (referred to as the "fin") of semiconductor material defining the elongated section used to form the channel of the transistor and also its source and drain zones. This fin is typically defined by a mask that is formed on top of a monocrystalline silicon substrate at the position of the fin. The substrate material is then directionally etched where there is no mask, to a determined depth, such that the elongated section defining the fin remains under the mask and is composed of the substrate material.

In one prior art implementation, the fin of semiconductor material which is thus obtained, and which comprises the channel of the final transistor, is not electrically insulated from the active portion of the circuit substrate, which itself is also of crystalline semiconductor material. Such a FinFET device suffers from three distinct types of leakage current. A first type of leakage current can circulate between the source and drain of the FinFET transistor, via the active portion of the substrate situated below the channel. This first leakage current, internal to each transistor, is not controlled by the potential applied to the transistor gate. A second type of leakage current arises because the channel of the FinFET transistor is also in electrical contact with the channels of other transistors of the same conductivity type via the substrate. The second leakage current flows between transistors in the form of an inter-transistor leakage current. A third type of leakage current appears between the channel of each FinFET transistor and a lower part of the substrate in response to the substrate being connected to a reference potential.

To address the leakage current issues noted above, procedures for dielectrically isolating the fin are known in the art.

In one technique, referred to as bottom oxidation through STIs (BOTS), shallow trench isolation (STI) structures are formed on either side of the fin. The silicon material of the fin is protected on a top side by barrier layer (for example, of silicon nitride) and the upper lateral sides of the fin are isolated from the STI structures by another barrier layer (also, for example, of silicon nitride). The integrated circuit wafer is then subjected to an oxidation process. The barrier layers function as oxygen ($O_2$) barriers and only a lower (unprotected) portion of the fin (below the lateral barrier layers) is converted to a thermal oxide material which isolates the upper portion of the fin from the underlying substrate material. This process produces an undesirable scalloped interface shape at the bottom of the fin (due to the nature of the thermal oxide growth). Additionally, the process is not compatible with fins made of silicon-germanium (SiGe), and thus cannot be advantageously used when forming p-channel SiGe FinFET devices.

In another technique, referred to silicon on nothing (SON), a bottom portion of the fin is formed of silicon-germanium while an upper portion of the fin is formed of silicon. A selective etch is performed to remove the bottom SiGe portion to open a region between the underside of the Si fin and the underlying substrate. A dielectric material fill operation is then performed to fill the opened region with an insulating material. This process presents mechanical stability issues with respect to the Si fin. Additionally, complete fill of the opened region with the insulating material cannot be assured, and any voids will accordingly present tunnel fill conformality issues.

To avoid leakage currents, it is known in the art to fabricate the FinFET transistor on an integrated circuit substrate which is of the Silicon-on-Insulator (SOI) type (as opposed to the use of bulk semiconductor substrates). An SOI substrate is formed of a top semiconductor (for example, silicon or silicon-germanium) layer over an insulating (for example, silicon dioxide) layer over a bottom semiconductor (for example, silicon) substrate layer. Reference is made to U.S. Pat. No. 6,645,797, the disclosure of which is incorporated by reference, which teaches a process for realizing a FinFET transistor from an SOI substrate. The transistor which is obtained is electrically insulated from the lower part of the substrate by the intermediate layer of insulating material, and thus leakage current concerns are reduced.

Further substrate development has reduced the thickness of the intervening insulating layer to about 50 nm to produce a substrate for use in transistor fabrication that is referred to as an extremely thin silicon on insulator (ETSOI) substrate. Still further substrate development has reduced the thicknesses of all substrate layers to produce a substrate for use in transistor fabrication that is referred to an ultra-thin body and buried oxide (UTBB) substrate where the thickness of the intervening insulating layer is about 25 nm (or less) and the thickness of the top semiconductor layer is about 5 nm to 10 nm. All of these substrates may more generally be referred to as SOI substrates.

The FinFET transistor implemented on an SOI substrate is considered by those skilled in the art as an attractive option for use in connection with circuits fabricated at aggressively scaled process technology nodes, and in particular is well suited for use in CMOS integrated circuit designs. Superior short channel control along with higher performance in comparison to conventional planar bulk devices are recognized as advantages associated with the selection of the FinFET for CMOS circuits.

Notwithstanding the foregoing, it is difficult with the SOI implementation to introduce stress to the channel region. There is a need in the art to provide both some form of fin isolation and further add stress to the channel.

SUMMARY

An embodiment forms a FinFET transistor with only a partial dielectric isolation of the fin. In this regard, the fin is considered to be partially isolated when only the channel portion of the fin (under the gate) is isolated from the underlying substrate but the source-drain regions are otherwise in contact with the substrate. To achieve this structure, the fin material outside of the channel region is removed and a subsequent regrowth of semiconductor material, for example using epitaxy, is performed on either side of the gate to define source and drain regions. The advantage of this fabrication technique is that the epitaxially grown source and drain regions on either side of the gate can add stress to the channel region formed by the fin while the channel remains isolated from the underlying substrate.

In an embodiment, an upper semiconductor material layer of a silicon on insulator (SOI) substrate is patterned to define elongated fins. A polysilicon semiconductor material layer is then deposited over and in between the elongated fins. This polysilicon material layer is then patterned to define elongated gates extending to perpendicularly cross over the elongated fins. Sidewall spacers are formed on side walls of the elongated gates. Portions of the elongated fins located between the elongated gates are then removed, along with an underlying insulating layer of the SOI substrate, to expose an underlying semiconductor material layer. One or more semiconductor material layers are then epitaxially grown from the underlying semiconductor material layer at locations between the elongated gates. The one or more semiconductor material layers may include an undoped epi-layer and an overlying doped epi-layer. These epitaxially grown structures form source-drain regions of a transistor device.

In an embodiment, a method comprises: on a substrate comprising a layer of a first semiconductor material, patterning the first semiconductor material to form a plurality of elongated fins; depositing a second semiconductor material over and in between the plurality of elongated fins; patterning the second semiconductor material to form a plurality of elongated gates extending to cross over the plurality of elongated fins; forming sidewall spacers on side walls of the elongated gates; removing the first semiconductor material of the elongated fins located between the elongated gates; and epitaxially growing additional semiconductor material between the elongated gates.

In an embodiment, a FinFET device comprises: a substrate supporting a plurality of elongated fins formed of a first semiconductor material; a plurality of elongated gates formed of a second semiconductor material, said elongated gates extending to cross over the plurality of elongated fins; sidewall spacers on side walls of the elongated gates; wherein first semiconductor material of the elongated fins located between the elongated gates has been removed; and epitaxial semiconductor material is present between the elongated gates.

In an embodiment, a method comprises: patterning a first semiconductor material to form an elongated fin that is isolated from an underlying substrate material by an insulating layer; forming an elongated gate structure extending to cross over the elongated fin; forming sidewall spacers on side walls of the elongated gate; removing portions of the elongated fin that are located on each side of, but not under, the elongated gate; removing portions of the insulating layer that are located on each side of, but not under, the elongated gate to expose a top surface of the underlying substrate material; and epitaxially growing additional semiconductor material from the exposed top surface of the underlying substrate material on each side of the elongated gate to provide source and drain regions in contact with a channel region formed by a portion of the elongated fin located under the elongated gate.

In an embodiment, a method comprises: patterning a first semiconductor material to form an elongated fin that is isolated from an underlying substrate material by an insulating layer; forming an elongated gate structure extending to cross over the elongated fin; forming sidewall spacers on side walls of the elongated gate; removing portions of the elongated fin that are located on each side of, but not under, the elongated gate; and epitaxially growing additional semiconductor material each side of the elongated gate to provide source and drain regions in contact with a channel region formed by a portion of the elongated fin located under the elongated gate. The step of epitaxially growing comprises: epitaxially growing a first epitaxial layer made of a first material; and epitaxially growing a second epitaxial layer made of a second material on said first epitaxial layer.

BRIEF DESCRIPTION OF THE DRAWINGS

For a better understanding of the embodiments, reference will now be made by way of example only to the accompanying figures in which:

FIGS. 1A-11B illustrate process steps in the formation of a FinFET device on a substrate.

DETAILED DESCRIPTION OF THE DRAWINGS

Reference is now made to FIGS. 1A-11B showing the process steps in the formation of a FinFET device on a substrate. It will be noted that the illustrations are not necessarily presented to scale.

Figure 1A:
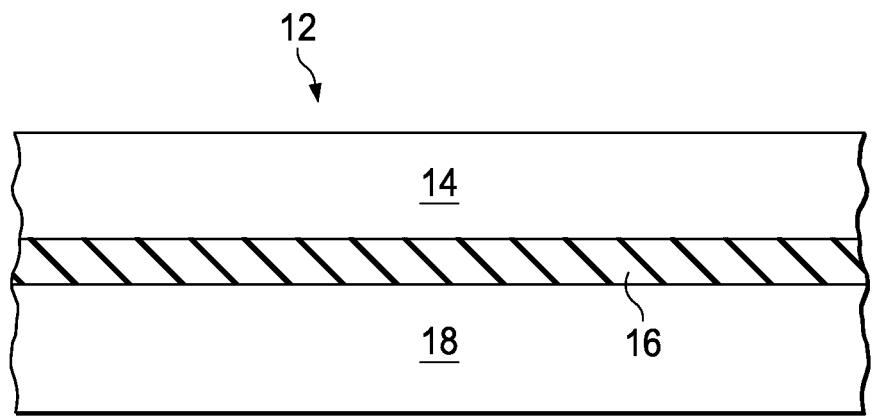

FIG. 1A shows a silicon on insulator (SOI) wafer 12 of a conventional type. For example, the wafer may comprise an ultra-thin body and buried oxide (UTBB) substrate. The substrate wafer 12 comprises a top semiconductor (for example, silicon or silicon-germanium) layer 14 over an insulating (for example, silicon dioxide) layer (BOX) 16 over a bottom semiconductor (for example, silicon) substrate layer 18. With a UTBB substrate, for example, the top semiconductor layer 14 may have a thickness of 5 nm to 100 nm, the insulating layer 16 may have a thickness of 5 nm to 100 nm, and the bottom semiconductor substrate layer 18 may have a thickness of 100 microns to 800 microns. The top semiconductor layer 14 and bottom semiconductor substrate layer 18 may be doped as appropriate for the integrated circuit application. The thickness of the top and bottom semiconductor layers 14 and 18 may be tuned (for example, through the use of a thinning or epitaxy operation) as needed for the integrated circuit application. The top semiconductor layer 14 may, in a preferred embodiment, have a fully depleted (FD) configuration. Although a UTBB substrate is preferred, it will be understood that the substrate could comprise a silicon on insulator (SOI) substrate of any configuration including an extremely thin silicon on insulator (ETSOI) substrate.

Figure 1B:
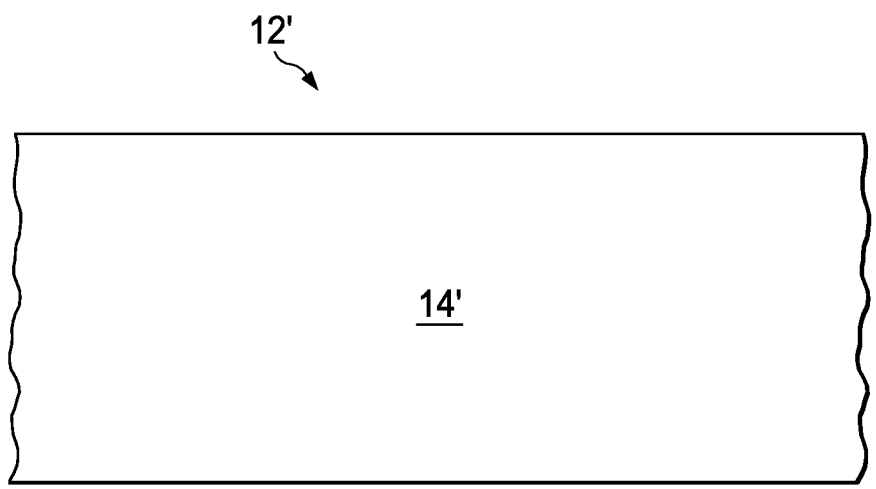

FIG. 1B alternatively shows a starting bulk substrate wafer 12'. The wafer 12' comprises a semiconductor material layer 14' doped as appropriate for the integrated circuit application. The semiconductor material layer 14' may comprise a number of epitaxially grown layers of semiconductor material.

FIG. 2A shows the deposit of a silicon nitride (SiN) layer 20 over the top of the layer 14 of wafer 12, and FIG. 2B shows the deposit of a silicon nitride (SiN) layer 20 over the top of the layer 14' of wafer 12'. This layer 20 may have a thickness of 10 nm to 100 nm and may be deposited using well known process techniques such as PECVD or RTCVD. Although a SiN material is used for masking, it will be understood that the $SiO_2$/SiN hard mask may alternatively be used.

Figure 3A:
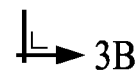
Figure 3B:
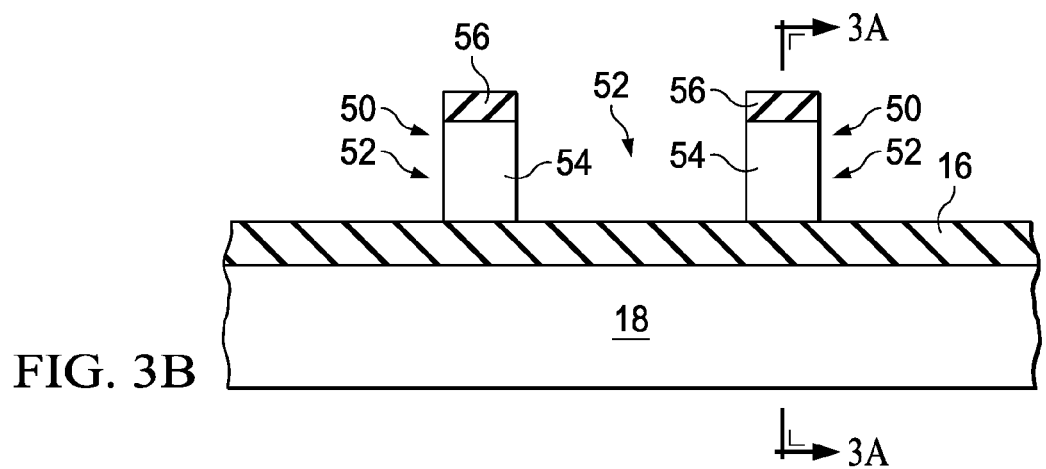

Reference is now made to FIGS. 3A and 3B which illustrate perpendicular cross-sectional views of the wafer 12. A lithographic process as known in the art is then used to define the fins 50 for the FinFET devices. The silicon nitride (SiN) layer 20 applied over the top surface of the top semiconductor layer 14 is lithographically patterned in a manner known in the art to leave SiN mask (cap 56) material at the desired locations of the fins 50. An etching operation is then performed to open apertures 52 in the top semiconductor layer 14 on either side of each fin 50. The apertures 52 further extend to a depth sufficient to reach the insulating layer 16 so as to ensure the fin depth passes completely through the top semiconductor layer 14. Each fin 50 is accordingly formed to include a region 54 made of the top semiconductor layer 14 over the insulating layer 16 with an overlying silicon nitride cap 56. In a preferred implementation, the etching process may utilize a sidewall image transfer (SIT) process such as that described, for example, in U.S. Pat. No. 8,298,954, the disclosure of which is incorporated by reference.

Figure 3C:
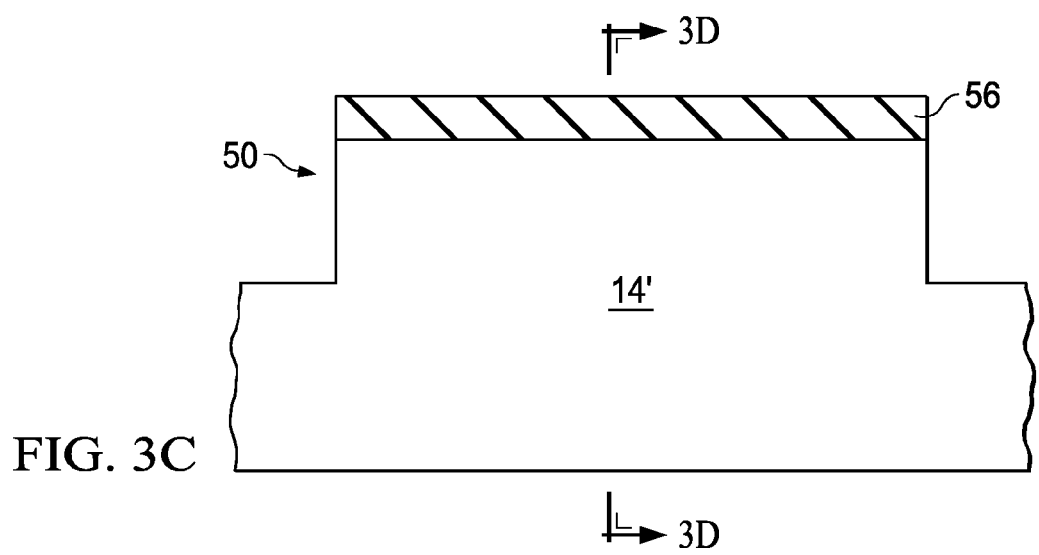
Figure 3D:
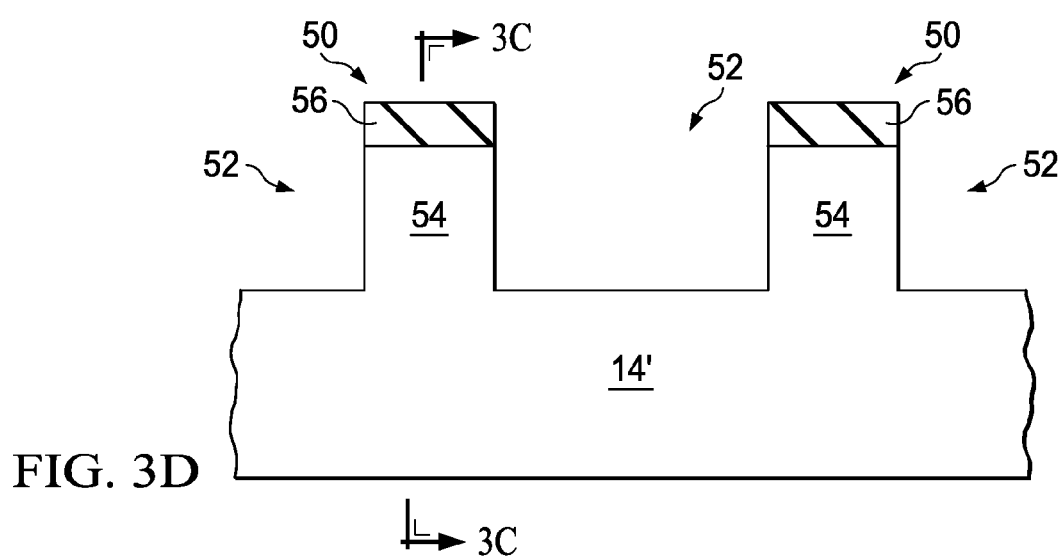

FIGS. 3C and 3D illustrate perpendicular cross-sectional views of the wafer 12'. A lithographic process as known in the art is used to define the fins 50 for the FinFET devices. The silicon nitride (SiN) layer 20 applied over the top surface of the wafer 12' is lithographically patterned in a manner known in the art to leave SiN mask material (cap 56) at the desired locations of the fins 50. An etching operation is then performed to open apertures 52 in the wafer 12' on either side of each fin 50. The apertures 52 further extend to a targeted depth in the layer 14' at least sufficient to define material for the fin. In a preferred implementation, the etching process may utilize a sidewall image transfer (SIT) process such as that described, for example, in U.S. Pat. No. 8,298,954, the disclosure of which is incorporated by reference.

Any suitable technique known in the art may then be used on the wafer 12' to form an insulating region 16 below each fin 50 so as to separate a region 54 made of semiconductor material layer 14' (with an overlying silicon nitride cap 56) from a bottom portion of the layer 14' referred to as a semiconductor substrate layer 18. For example, the known bottom oxidation through STIs (BOTS) technique or silicon on nothing (SON) technique may be used to form the insulating region 16. The result of the fin insulating process produces a structure as generally shown in FIG. 3B.

Given that the wafers 12 and 12' at this point have a same or very similar structure, the remainder of the process description will be provided with the understanding that the process started from either an SOI substrate wafer 12 or a bulk substrate wafer 12' (with a general reference being made to the "wafer") and continues from the structure illustrated in FIG. 3B.

Figure 4:
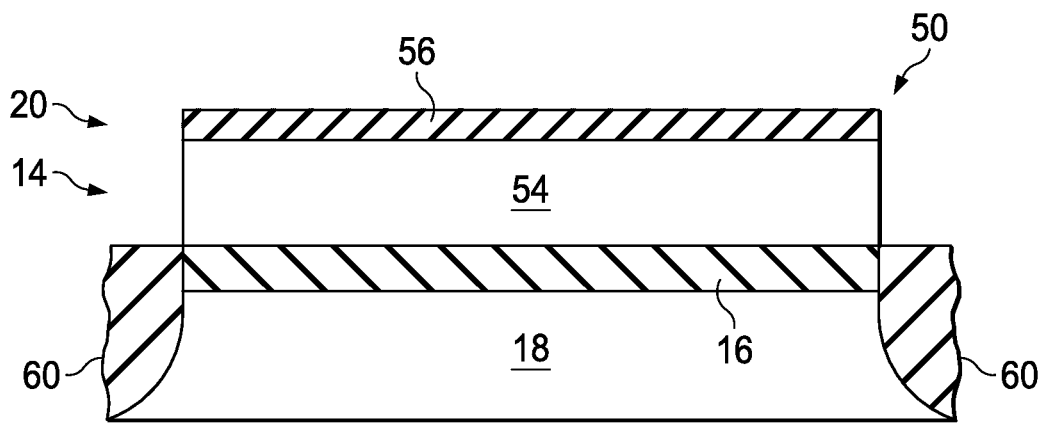

With reference to FIG. 4, a shallow trench isolation (STI) structure 60 is formed using conventional techniques well known to those skilled in the art. As an example, trenches may be formed in the insulating layer 16 and bottom semiconductor substrate layer 18 which surround active regions of the wafer. An etch, for example comprising a reactive ion beam etching process (RIE as known in the art), may be used to open the trenches. The trenches are then filled with an insulating material such a silicon dioxide using a HARP or TEOS or flowable oxide process (known in the art) followed by a high temperature anneal for densification. In an embodiment as illustrated, the STI structure 60 may extend completely through the thickness of the bottom semiconductor substrate layer 18.

It will be understood by those skilled in the art that the STI structures 60 could alternatively be formed before defining the fins. However, STI formation before fin definition is not preferred as this may lead to issues with overlay. It is preferred to form the more dense structures (such as fins) first before forming other structures as this makes alignment easier.

Figure 5A:
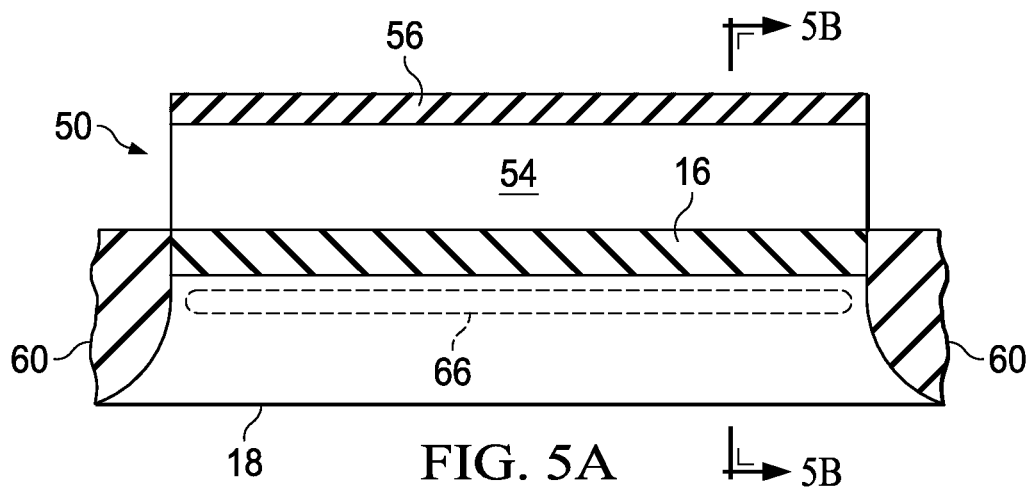
Figure 5B:
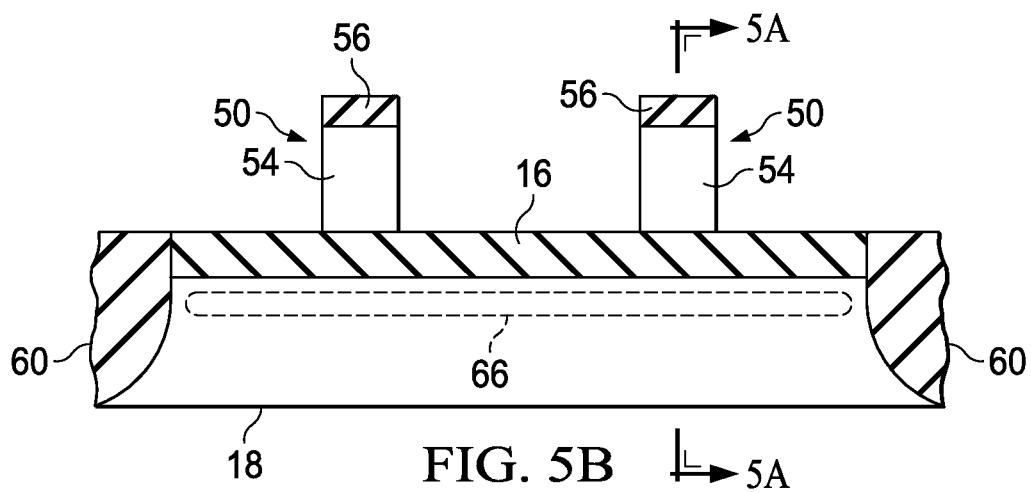

With reference to FIGS. 5A and 5B, a punch through stopper (PTS) implant 66 of arsenic, phosphorous, boron or indium dopant is made through the insulating layer 16 and into an upper surface of the bottom semiconductor substrate layer 18. For example, an ion beam implantation process may be used to achieving the implant 66. This implant 66 is important to the operation of any resulting FinFET device because the implant functions to suppress leakage between source and drain during normal operation of the device. For example, n-type implantation 66 is used for isolating on p-channel devices and p-type implantation 66 is used for isolating on n-channel devices.

Figure 6A:
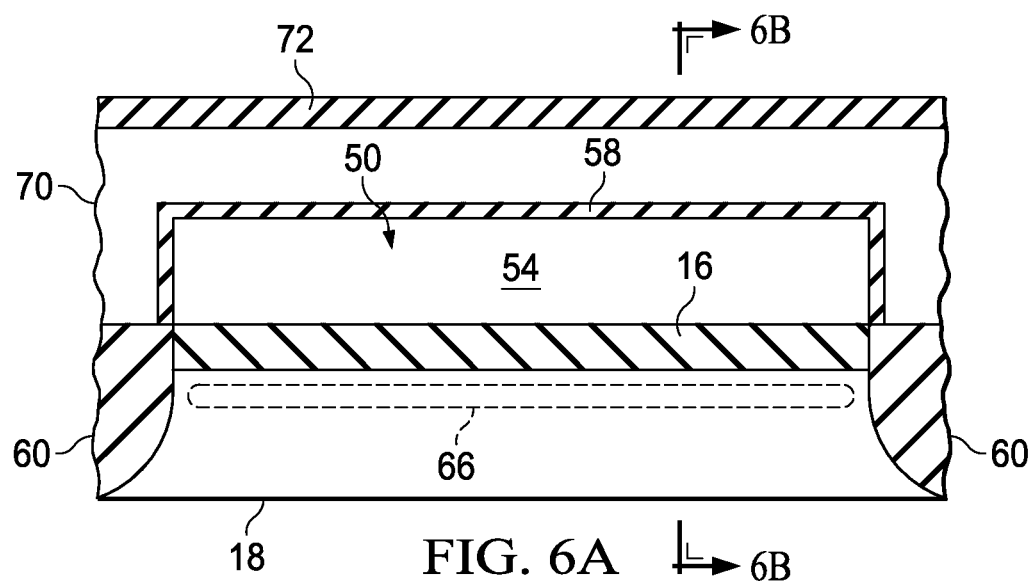
Figure 6B:
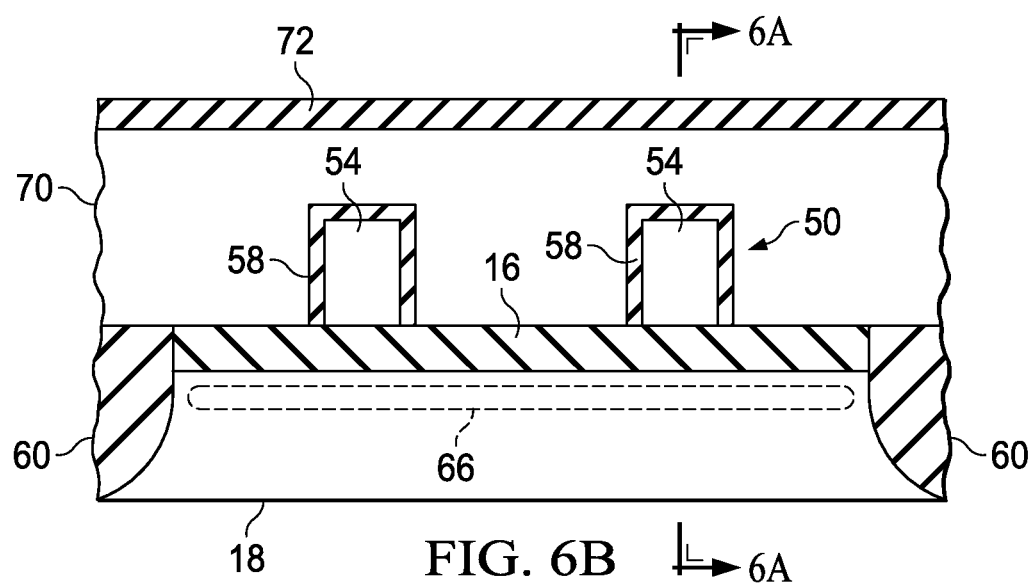

With reference to FIGS. 6A and 6B, after removal of the cap 56 (using, for example, using a selective etch of $H_3PO_4$ for the SiN cap, HF or COR or SiCoNi for the $SiO_2$ cap), an oxide material layer 58 is formed on the exposed surfaces of the fin 54. This oxide layer 58 is deposited, for example, using low temperature atomic layer deposition (ALD), to form a gate oxide. A deposition process well known in the art such CVD is used to blanket deposit a layer of polysilicon 70 over the wafer. The material 70 may alternatively comprise amorphous silicon. Following planarization, for example using chemical mechanical polishing (CMP), a silicon nitride (SiN) layer 72 is deposited over the polysilicon layer 70.

As understood by those skilled in the art, the oxide layer 58 and polysilicon layer 70 form structures known in the art as "dummy gate" structures. Accordingly, there is no need to dope the polysilicon 70 material. The dummy gate structures will be subsequently removed later in the fabrication process and replaced with a gate stack defining the actual operating gate electrode of the FinFET device.

Figure 7A:
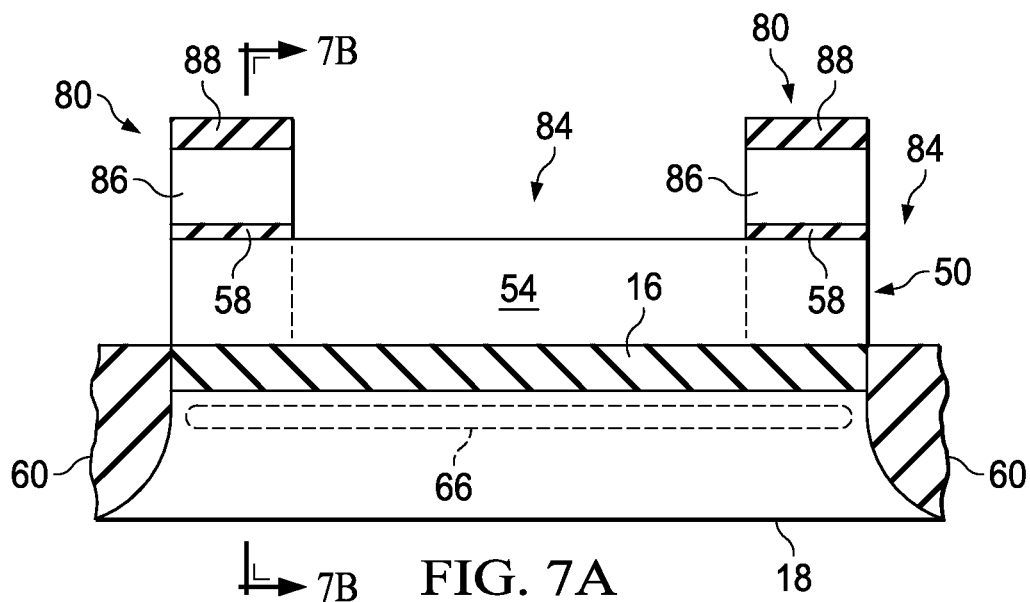
Figure 7B:
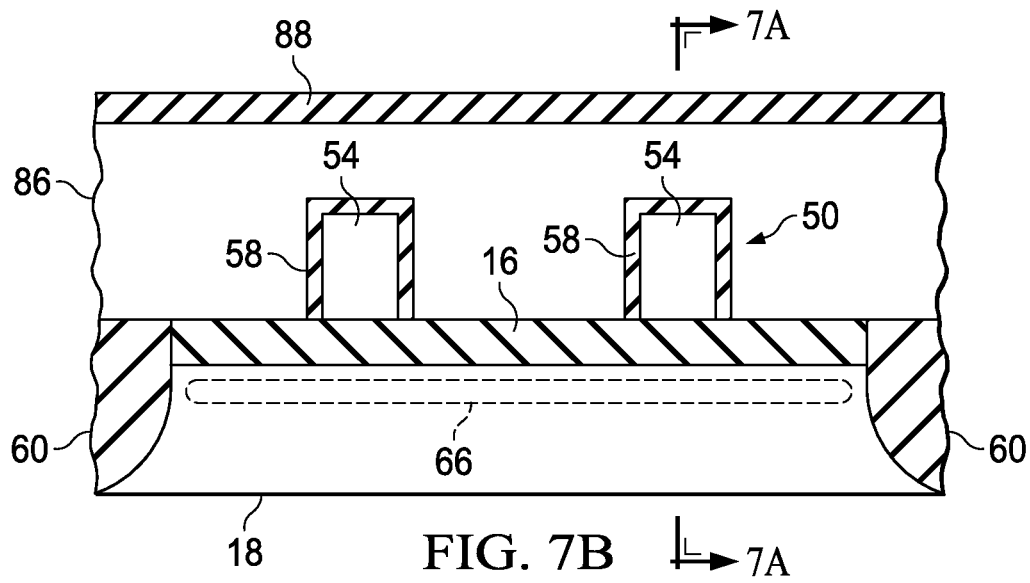

A lithographic process as known in the art is then used to define the dummy gate stack structures 80 for the FinFET devices. The silicon nitride (SiN) layer 72 applied over the top surface of the polysilicon layer 70 is lithographically patterned to leave SiN mask material (cap 88) at the desired locations of the dummy gates. A reactive ion etching (RIE) operation is then performed to open apertures 84 in the polysilicon layer 70 on either side of each dummy gate 80. The apertures 84 extend to a depth sufficient to reach the insulating layer 16 and separate the gates 80 but do not remove the material of the fin 50. Each dummy gate 80 is accordingly formed to include a region 86 made of the polysilicon layer 70 with an overlying silicon nitride cap 88. The result is shown in FIGS. 7A and 7B.

Figure 8:
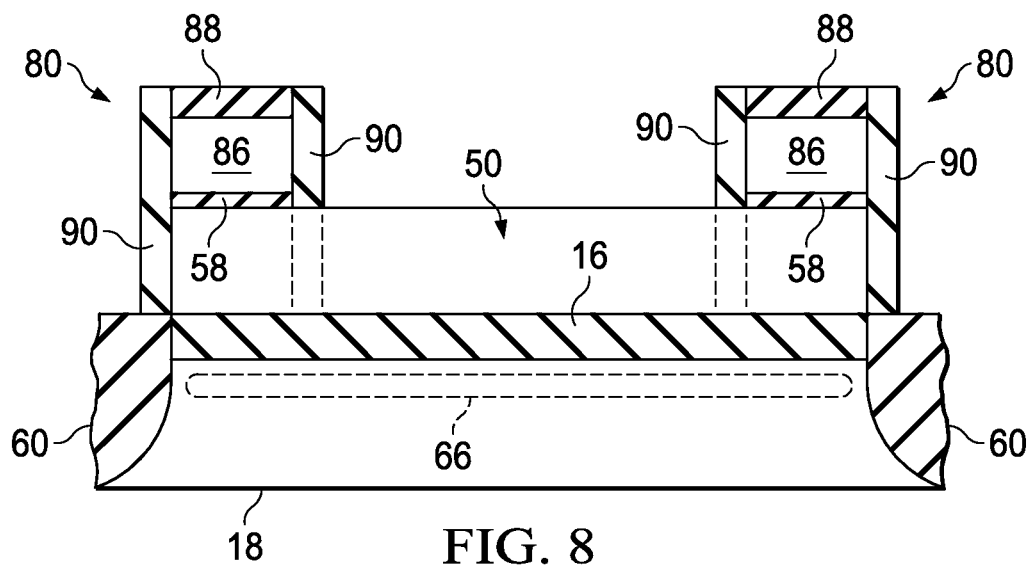

A silicon nitride (SiN) material 90 is then deposited (for example, using an atomic layer deposition (ALD) process at low temperature) on the side walls of the polysilicon material defining the dummy gate stack structures 80 to form sidewall spacer structures. The result is shown in FIG. 8.

Figure 9A:
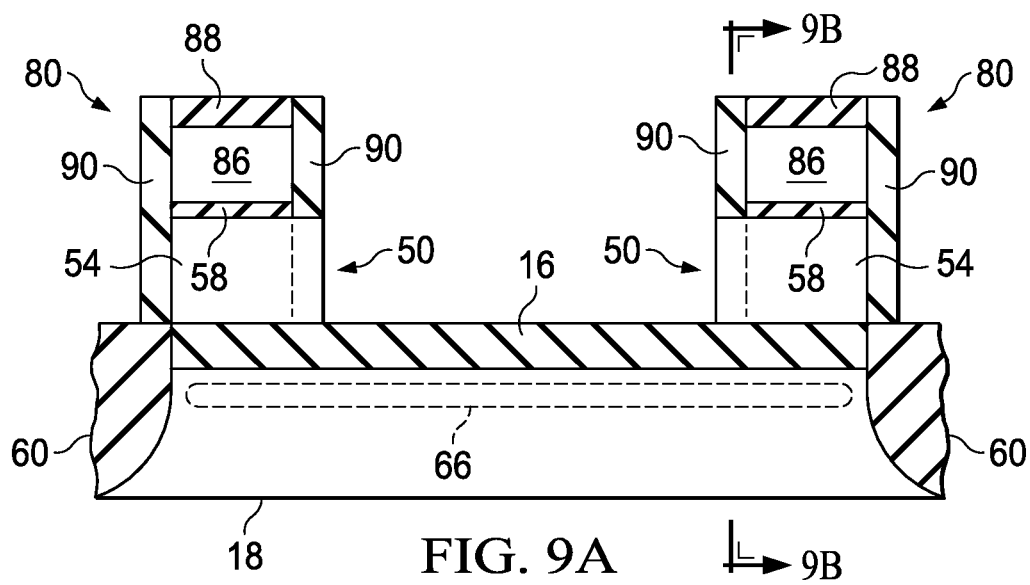
Figure 9B:
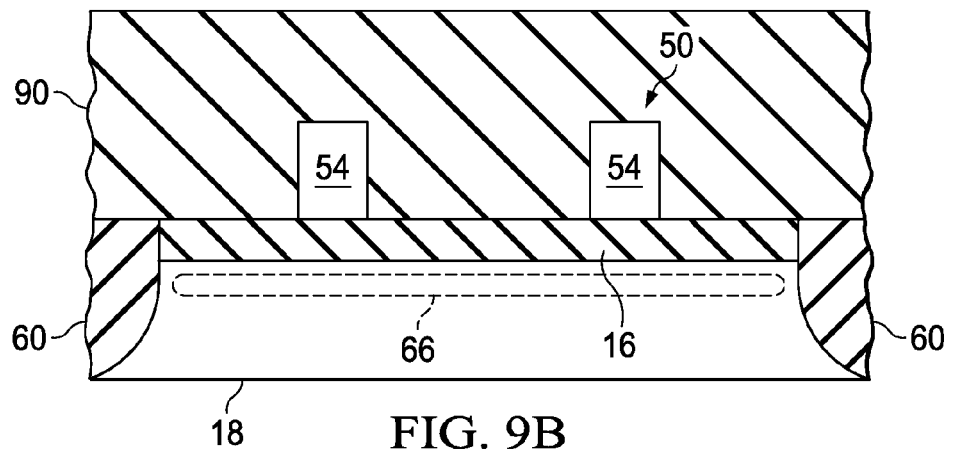
Figure 9C:
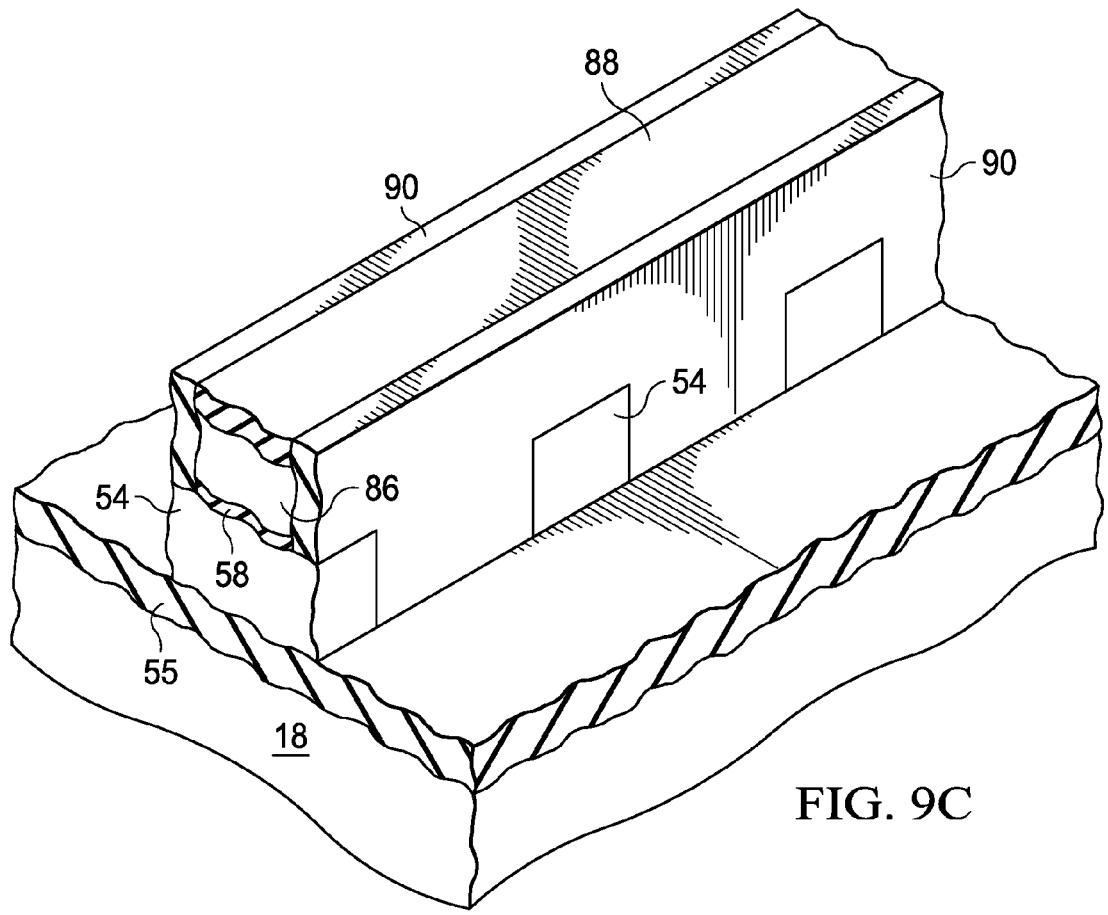

The silicon material of the fins 50 which is present between dummy gate stack structures 80 is then removed. As an example, an etch such as a wet HF etch or RIE process that is selective to nitride and oxide may be used to remove the silicon material. The result is shown in FIGS. 9A, 9B and 9C (wherein FIG. 9C shows a perspective view).

Figure 10A:
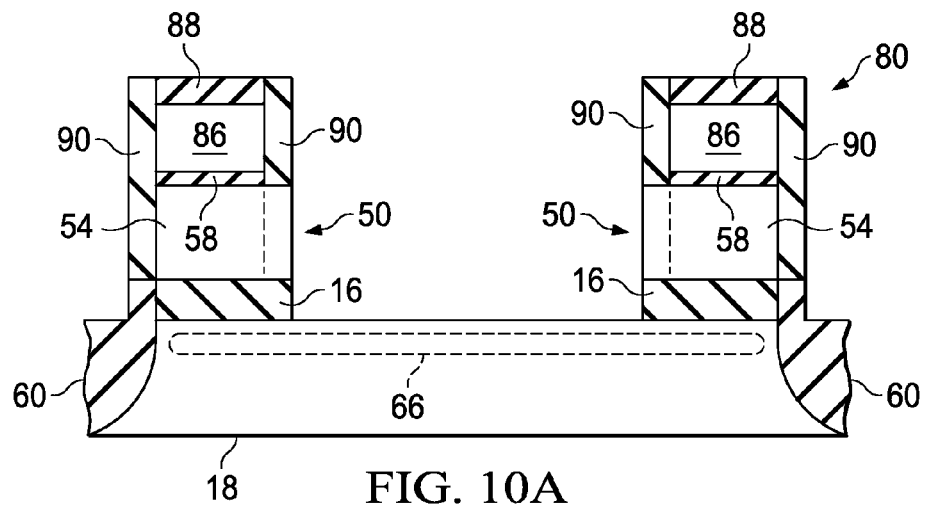
Figure 10B:
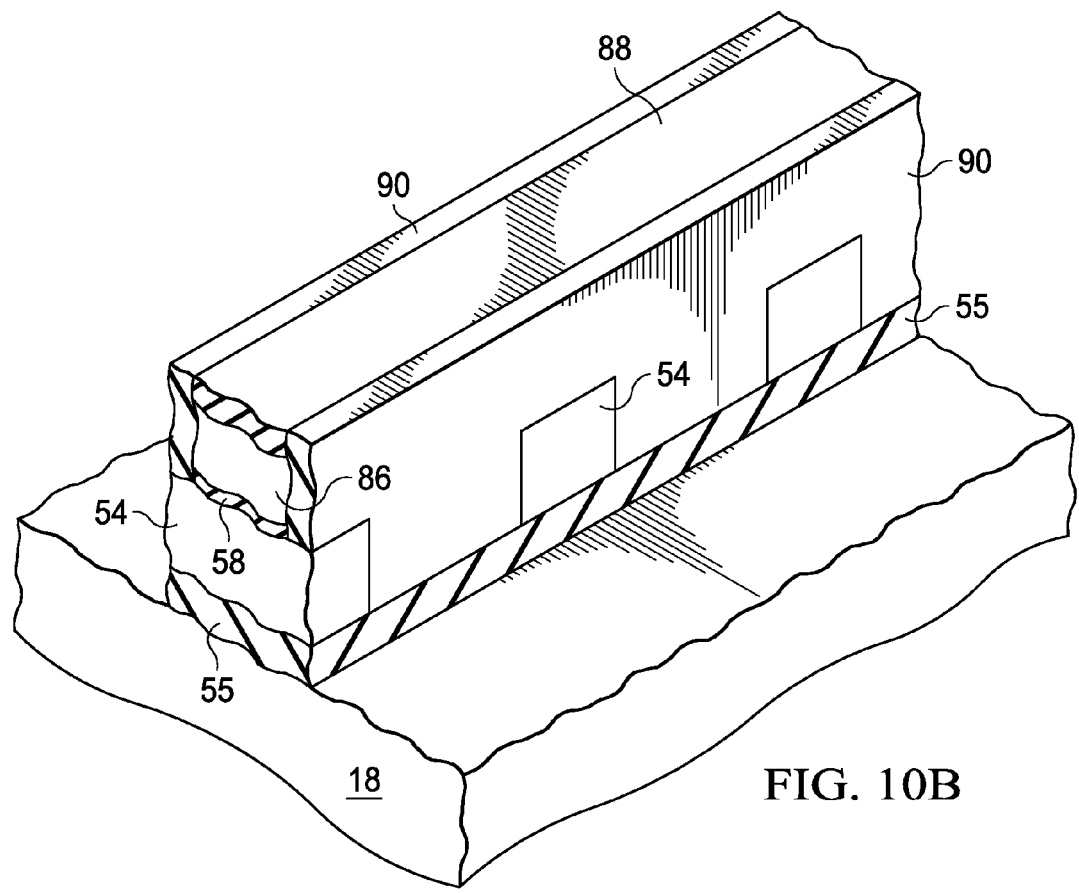

A further etch is then performed to remove the buried oxide layer 16 between gate stack structures 80 and stopping on bottom semiconductor substrate layer 18. As an example, an etch such as a wet HF etch or RIE process that is selective to nitride and silicon may be used to remove the oxide material. The result is shown in FIGS. 10A and 10B (wherein FIG. 10B shows a perspective view).

Figure 11A:
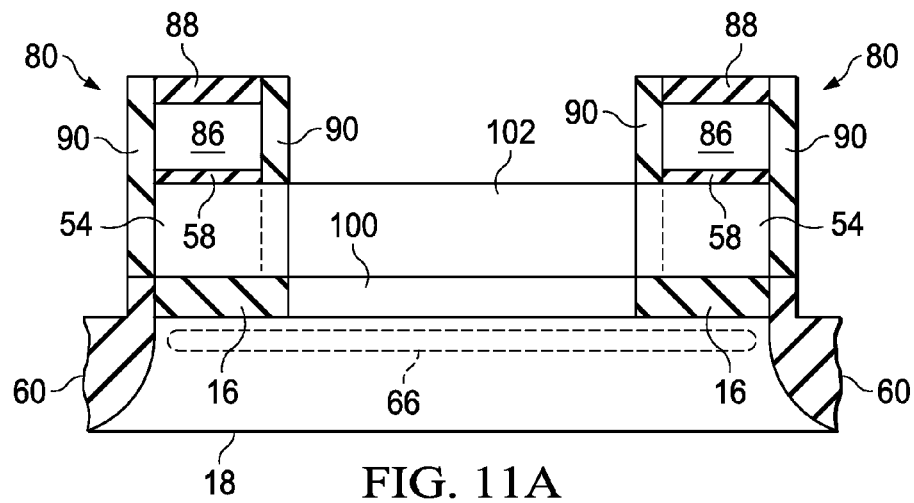
Figure 11B:
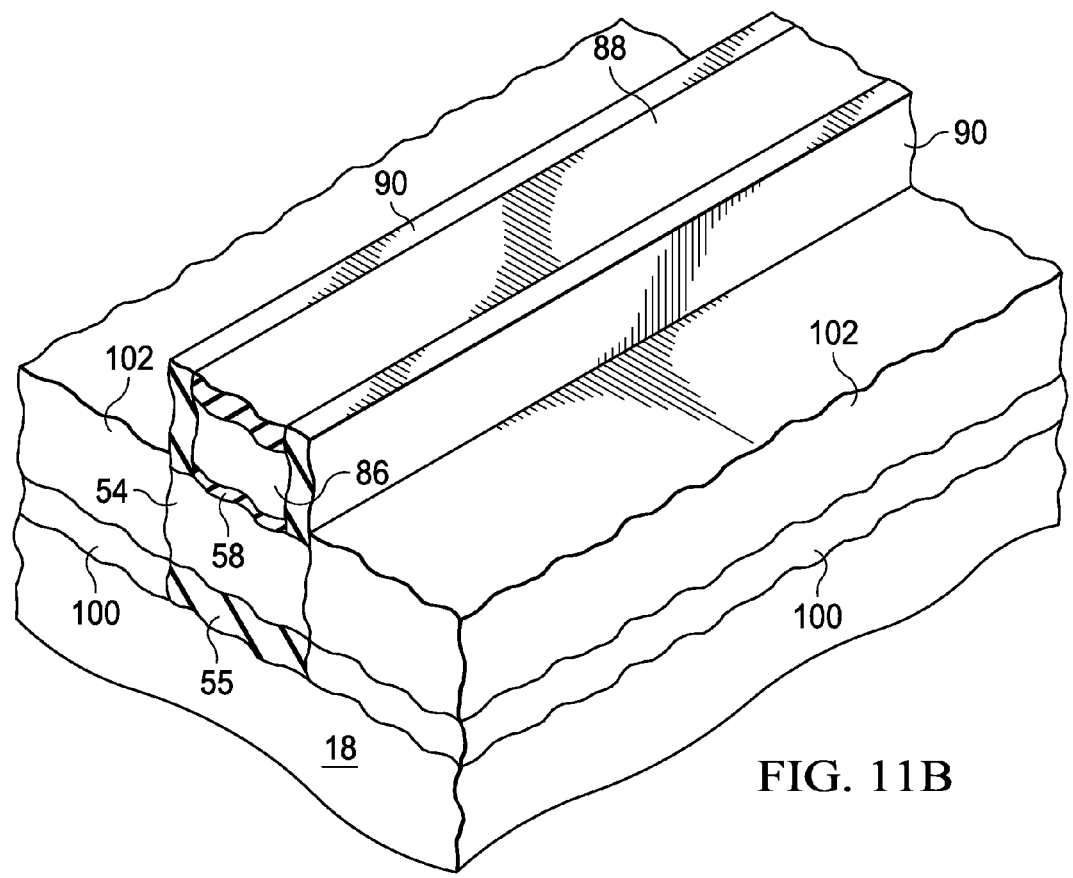

Using an epitaxial process tool, an epitaxial growth process as known in the art is then performed to grow multiple epitaxial layers from the exposed bottom semiconductor substrate layer 18 in the area between dummy gate stack structures 80. The result is shown in FIGS. 11A and 11B (wherein FIG. 11B shows a perspective view). For example, a first epitaxial growth layer 100 may be provided followed by a second epitaxial growth layer 102. The first layer may have a thickness of 5 nm to 100 nm and the second layer may have a thickness of 5 nm to 100 nm. One or both of the epitaxial growth layers 100 and 102 may be undoped. Alternatively, one or both of the epitaxial growth layers 100 and 102 may be in-situ doped. As an example, the first epitaxial growth layer 100 may comprise an undoped buffer layer. For example, the layer 100 may comprise undoped silicon-germanium (SiGe). For example, the layer 100 may comprise undoped silicon-carbide (SiC). This layer 100 is provided for junction leakage control and to apply strain to the channel provided by the fin 50. As a further example, the second epitaxial growth layer 102 may comprise a low resistivity in-situ doped layer. For example, the layer 102 may comprise silicon-germanium (SiGe) doped with Boron. For example, the layer 102 may comprise silicon-carbide (SiC) doped with Phosphorous. The layers 100 and 102 define the source-drain regions of the device in contact with the bottom semiconductor substrate layer 18 and the regions 54.

The remaining steps performed to complete transistor fabrication include: 1) after completing the epitaxial growth, a thick oxide is deposited over the wafer; 2) a planarization process, such as CMP, is performed stopping on the dummy gate polysilicon material 86; 3) a selective removal process is performed to remove the dummy gate polysilicon material 86 and dummy gate oxide material 58; 4) the resulting opening is then filled with a gate stack; and 5) final contact processing is performed followed by back-end-of-line (BEOL) processing for metallization layer definition to finish fabrication of the device. In this regard, the resulting FinFET device will have a structure like that shown in FIGS. 11A and 11B except that the dummy gate material 86 and dummy gate oxide material 58 will be replaced with, for example, a gate stack including an insulating material and a gate electrode.

The process for FinFET formation disclosed herein is fully compatible with the formation of silicon-germanium (SiGe) fins. At the level of the layer 14, portions of the silicon substrate may replaced with SiGe regions. This can be accomplished in a number of ways known to those skilled in the art, including: removal of silicon material 14 with growth of SiGe or SiGe deposition to make the SiGe regions. The remaining process steps as described above are then performed to fabricate fins of silicon material for n-channel devices and fins of silicon-germanium material for p-channel devices. By providing silicon regions and silicon-germanium regions on a same wafer, the process will support the formation of CMOS circuitry.

The process for FinFET formation disclosed herein possesses a number of advantages over prior art processes including: a) the process allows for control to be exercised over the thickness uniformity of the dielectric material and silicon fin material; b) the process utilizes a starting FDSOI substrate that is already in use in semiconductor processing; c) the process advantageously uses an undoped silicon channel so as to enable production with low device variability; d) known process steps implemented in a unique way provide for implementation of partial isolation of the fins; e) the FDSOI wafer may advantageously use either silicon-germanium based silicon on insulator (SGOI) substrate wafers or silicon-based silicon on insulator (SOI) substrate wafers in order to address design concerns with respect to mobility enhancement; and f) rotated or (110) orientation wafers may be used with the process to address concerns with epitaxy defect control.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
patterning a first semiconductor material to form a plurality of elongated fins that are isolated from an underlying substrate material by an insulating layer;
depositing a second semiconductor material over and in between the plurality of elongated fins;
patterning the second semiconductor material to form a plurality of elongated gates extending to cross over the plurality of elongated fins;
forming sidewall spacers on side walls of the elongated gates;
removing the first semiconductor material of the elongated fins located between, but not under, the elongated gates; and
epitaxially growing additional semiconductor material between the elongated gates.

2. The method of claim 1, wherein the substrate is a silicon on insulator (SOI) substrate and the layer of the first semiconductor material is an upper layer of the SOI substrate.

3. The method of claim 2, wherein the first semiconductor material is one of silicon or silicon-germanium.

4. The method of claim 1, wherein the second semiconductor material is polysilicon.

5. The method of claim 1, wherein removing the first semiconductor material of the elongated fins located between, but not under, the elongated gates further comprises removing the insulating layer underlying the layer of the first semiconductor material located between, but not under, the elongated gates to expose the underlying substrate material.

6. The method of claim 5, wherein epitaxially growing additional semiconductor material comprises epitaxially growing the additional semiconductor material from said exposed underlying substrate material.

7. The method of claim 5, wherein epitaxially growing additional semiconductor material comprises:
epitaxially growing a first epitaxial layer made of a first material on the exposed underlying substrate material; and
epitaxially growing a second epitaxial layer made of a second material on said first epitaxial layer and in contact with the elongated fins located under the elongated gates.

8. The method of claim 7, wherein the first material is undoped and the second material is in-situ doped.

9. The method of claim 5, wherein said underlying substrate material includes a punch through stopper (PTS) implant.

10. The method of claim 1, wherein said additional semiconductor material is selected from the group consisting of silicon-germanium and silicon-carbide.

11. The method of claim 1, wherein epitaxially growing additional semiconductor material comprises:
epitaxially growing an undoped epitaxial layer; and
epitaxially growing a doped epitaxial layer on said undoped epitaxial layer and in contact with the elongated fins located under the elongated gates.

12. The method of claim 1, further comprising forming a shallow trench isolation structure surrounding an active region within which the plurality of elongated fins and are located.

13. The method of claim 1, wherein the plurality of elongated gates cross over the plurality of elongated fins with a perpendicular orientation.

14. A method, comprising:
patterning a first semiconductor material to form an elongated fin that is isolated from an underlying substrate material by an insulating layer;
forming an elongated gate structure extending to cross over the elongated fin;
forming sidewall spacers on side walls of the elongated gate;
removing portions of the elongated fin that are located on each side of, but not under, the elongated gate;
removing portions of the insulating layer that are located on each side of, but not under, the elongated gate to expose a top surface of the underlying substrate material; and
epitaxially growing additional semiconductor material from the exposed top surface of the underlying substrate material on each side of the elongated gate to provide source and drain regions in contact with a channel region formed by a portion of the elongated fin located under the elongated gate.

15. The method of claim 14, wherein the substrate is a silicon on insulator (SOI) substrate and the layer of the first semiconductor material is an upper layer of the SOI substrate.

16. The method of claim 14, wherein epitaxially growing additional semiconductor material comprises:
epitaxially growing a first epitaxial layer made of a first material on the exposed top surface of the underlying substrate material; and
epitaxially growing a second epitaxial layer made of a second material on said first epitaxial layer and in contact with the channel region.

17. The method of claim 16, wherein the first material is undoped and the second material is in-situ doped.

18. The method of claim 14, further comprising implanting a punch through stopper (PTS) implant in said underlying substrate material.

19. A method, comprising:
patterning a first semiconductor material to form an elongated fin that is isolated from an underlying substrate material by an insulating layer;
forming an elongated gate structure extending to cross over the elongated fin;
forming sidewall spacers on side walls of the elongated gate;
removing portions of the elongated fin that are located on each side of, but not under, the elongated gate; and
epitaxially growing additional semiconductor material each side of the elongated gate to provide source and drain regions in contact with a channel region formed by a portion of the elongated fin located under the elongated gate, wherein epitaxially growing comprises:
epitaxially growing a first epitaxial layer made of a first material; and
epitaxially growing a second epitaxial layer made of a second material on said first epitaxial layer.

20. The method of claim 19, wherein the substrate is a silicon on insulator (SOI) substrate and the layer of the first semiconductor material is an upper layer of the SOI substrate.

21. The method of claim 19, wherein the first epitaxial layer is undoped and the second epitaxial layer is in-situ doped.

22. The method of claim 19, further comprising implanting a punch through stopper (PTS) implant in said underlying substrate material.

23. The method of claim 19, wherein the first material is selected from the group consisting of undoped silicon-germanium and undoped silicon-carbide, and wherein the second material is selected from the group consisting of doped silicon-germanium and doped silicon-carbide.

* * * * *